United States Patent
Li et al.

(10) Patent No.: US 7,073,104 B1
(45) Date of Patent: Jul. 4, 2006

(54) METHOD AND SYSTEM FOR APPLYING TESTING VOLTAGE SIGNAL

(75) Inventors: Jiang Li, San Jose, CA (US); Richard Fastow, Cupertino, CA (US); Steve Tam, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 141 days.

(21) Appl. No.: 10/384,856

(22) Filed: Mar. 10, 2003

(51) Int. Cl.
*G11C 29/00* (2006.01)

(52) U.S. Cl. .................................. 714/718; 365/185.19
(58) Field of Classification Search ................ 73/662; 365/185.19, 185.22, 185.11, 189.09, 185.03; 714/718

See application file for complete search history.

(56) References Cited

U.S. PATENT DOCUMENTS

| | | | | |
|---|---|---|---|---|
| 3,751,994 A | * | 8/1973 | Gross | 73/662 |
| 5,856,946 A | * | 1/1999 | Chan et al. | 365/185.19 |
| 6,188,609 B1 | * | 2/2001 | Sunkavalli et al. | 365/185.22 |
| 6,240,017 B1 | * | 5/2001 | Le et al. | 365/185.19 |
| 6,275,415 B1 | * | 8/2001 | Haddad et al. | 365/185.11 |
| 6,275,424 B1 | * | 8/2001 | Le et al. | 365/189.09 |
| 6,418,349 B1 | | 7/2002 | Hahn et al. | 700/3 |
| 6,514,446 B1 | | 2/2003 | Smith et al. | 264/299 |
| 6,514,646 B1 | | 2/2003 | Nair et al. | 430/11 |
| 6,517,618 B1 | | 2/2003 | Foucher et al. | 106/31 |
| 6,577,537 B1 | * | 6/2003 | Mihnea et al. | 365/185.19 |
| 6,845,039 B1 | * | 1/2005 | Chen et al. | 365/185.03 |

* cited by examiner

*Primary Examiner*—David Ton
(74) *Attorney, Agent, or Firm*—Monica H. Choi

(57) ABSTRACT

In a method and system for applying a testing voltage signal, a voltage source generates the testing voltage signal that ramps from an initial voltage to an intermediate voltage with a first ramping rate. In addition, the testing voltage then ramps from the intermediate voltage to an end voltage with a second ramping rate, with the first ramping rate being greater than the second ramping rate. The present invention may be applied to particular advantage when the testing voltage signal is applied on a control gate of a flash memory cell for channel erasure of the flash memory cell. In this manner, the testing voltage signal ramps to the end voltage with reduced time for minimizing testing time.

20 Claims, 6 Drawing Sheets

METHOD AND SYSTEM FOR APPLYING TESTING VOLTAGE SIGNAL

TECHNICAL FIELD

The present invention relates generally to testing integrated circuits such as flash memory cells, and more particularly, to a method and system for applying a testing voltage signal that ramps to an end voltage with reduced time.

BACKGROUND OF THE INVENTION

Referring to FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a P-well 103 formed within a semiconductor substrate 105. In addition, a floating gate structure 104, comprised of a conductive material such as polysilicon for example, is disposed over the tunnel dielectric structure 102.

In addition, a floating dielectric structure 106, typically comprised of silicon dioxide ($SiO_2$), is disposed over the floating gate structure 104. A control gate structure 108, comprised of a conductive material, is disposed over the floating dielectric structure 106. The tunnel dielectric structure 102, the floating gate structure 104, the floating dielectric structure 106, and the control gate structure 108 form a gate stack of the flash memory cell 100.

A drain bit line junction 110 is formed toward the left of the gate stack of the flash memory cell 100 within an active device area of the P-well 103 defined by STI (shallow trench isolation) structures 107. Similarly, a source bit line junction 114 is formed toward the right of the gate stack of the flash memory cell 100 within the active area of the P-well 103. When the P-well 103 is doped with a P-type dopant, the drain and source bit line junctions 110 and 114 are doped with an N-type dopant, such as arsenic (As) or phosphorous (P) for example, for forming an N-channel flash memory cell 100. Such a structure of the flash memory cell 100 is known to one of ordinary skill in the art of flash memory technology.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of electronics.

FIG. 2 illustrates a circuit diagram representation of the flash memory cell 100 of FIG. 1 including a control gate terminal 150 coupled to the control gate structure 108, a drain terminal 152 coupled to the drain bit line junction 110, a source terminal 154 coupled to the source bit line junction 114, and a P-well terminal 156 coupled to the P-well 103. FIG. 3 illustrates a flash memory device 200 comprised of an array of flash memory cells, as known to one of ordinary skill in the art of flash memory technology. Referring to FIG. 3, the array of flash memory cells 200 includes rows and columns of flash memory cells with each flash memory cell having similar structure to the flash memory cell 100 of FIGS. 1 and 2. The array of flash memory cells 200 of FIG. 3 is illustrated with 2 columns and 2 rows of flash memory cells for simplicity and clarity of illustration. However, a typical array of flash memory cells comprising an electrically erasable and programmable memory device has more numerous rows and columns of flash memory cells.

Further referring to FIG. 3, in the array of flash memory cells 200 comprising a flash memory device, the control gate terminals of all flash memory cells in a row of the array are coupled together to form a respective word line for that row. In FIG. 3, the control gate terminals of all flash memory cells in the first row are coupled together to form a first word line 202, and the control gate terminals of all flash memory cells in the second row are coupled together to form a second word line 204.

In addition, the drain terminals of all flash memory cells in a column are coupled together to form a respective bit line for that column. In FIG. 3, the drain terminals of all flash memory cells in the first column are coupled together to form a first bit line 206, and the drain terminals of all flash memory cells in the second column are coupled together to form a second bit line 208. Further referring to FIG. 3, the source terminal of all flash memory cells of the array 200 are coupled together to a source voltage $V_{SS}$, and the P-well terminal of all flash memory cells of the array 200 are coupled together to a substrate voltage $V_{SUB}$ during some modes of operation of the flash memory cell. Such a circuit of the array of flash memory cells comprising the flash memory device 200 is known to one of ordinary skill in the art of flash memory technology.

Referring to FIGS. 1, 2, and 4, FIG. 4 shows a testing voltage signal 210 applied on the control gate terminal 150 of the flash memory cell. For example, in a channel erase operation for a N-channel flash memory cell, a negative voltage is applied on the control gate 108 and a positive voltage is applied on the P-well 103 with the drain and source bit line junctions 110 and 114 left floating. The testing voltage signal 210 may be applied on the control gate 108 while a positive voltage is applied on the P-well 103 with the drain and source bit line junctions 110 and 114 left floating during testing for a channel erase process of the flash memory cell 100.

Referring to FIG. 4, for minimizing electric field degradation of the tunnel dielectric structure 102, the testing voltage signal 210 ramps up from an initial voltage 212 such as −5 Volts to an end voltage 214 such as −9 Volts. In FIG. 4, the testing voltage signal 210 ramps up an incremental voltage step 216 every incremental time period 218 until the end voltage 214 is reached at time point 220 from the beginning time point 219 with the initial voltage 212. In the prior art, the total amount of time to reach the end voltage 214 is determined by the incremental voltage step 216 and the incremental time period 218.

For example, assume that the incremental voltage step 216 is approximately −30.77 milli-Volts and that the incremental time period 218 is 1 milli-second. Then, in FIG. 4, the end voltage of −9 Volts is reached after a total time period of 130 milli-seconds (i.e., 130 incremental steps 218). After reaching the end voltage 214, the end voltage 214 is applied for a predetermined time period on the control gate terminal 150 for erasing the flash memory cell.

During testing of an array of flash memory cells, millions of programming and erasing cycles are performed on the flash memory cells. For each cycle of erasing the flash memory cells, the testing voltage signal 210 of FIG. 4 is applied on the control gate 218 of the flash memory cell. For reducing the time for testing the flash memory cells, the time to reach the end voltage 214 is desired to be minimized.

SUMMARY OF THE INVENTION

Accordingly, in a general aspect of the present invention, the time for a testing voltage signal to ramp to an end voltage is minimized.

In one embodiment of the present invention, in a method and system for applying a testing voltage signal, a voltage source generates the testing voltage signal that ramps from an initial voltage to an intermediate voltage with a first ramping rate. In addition, the testing voltage then ramps from the intermediate voltage to an end voltage with a second ramping rate, with the first ramping rate being greater than the second ramping rate.

In another embodiment of the present invention, the intermediate voltage is at least 70% of the end voltage. In yet a further embodiment of the present invention, the first ramping rate is at least 100 times greater than the second ramping rate, such as when the first ramping rate is about 1000 times the second ramping rate.

The present invention may be applied to particular advantage when the testing voltage signal is applied on a control gate of a flash memory cell for channel erasure of the flash memory cell. In an example embodiment, the initial voltage is about −5 Volts, the intermediate voltage is about −7 Volts, and the end voltage is about −9 Volts. In that example, the initial voltage ramps to the intermediate voltage with an incremental voltage step every 1 micro-second, and the intermediate voltage ramps to the end voltage with the incremental voltage step every 1 milli-second.

In this manner, the testing voltage signal is ramped from the initial voltage to the end voltage with a minimized total time since the beginning portion of the testing voltage signal having lower magnitude is ramped at a faster rate. Yet, because the lower magnitude portion of the testing voltage signal is ramped at the faster rate, the degradation of the tunnel dielectric structure of the flash memory cell is limited.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, and 7 refer to elements having similar structure and function.

DETAILED DESCRIPTION

Figure 1:
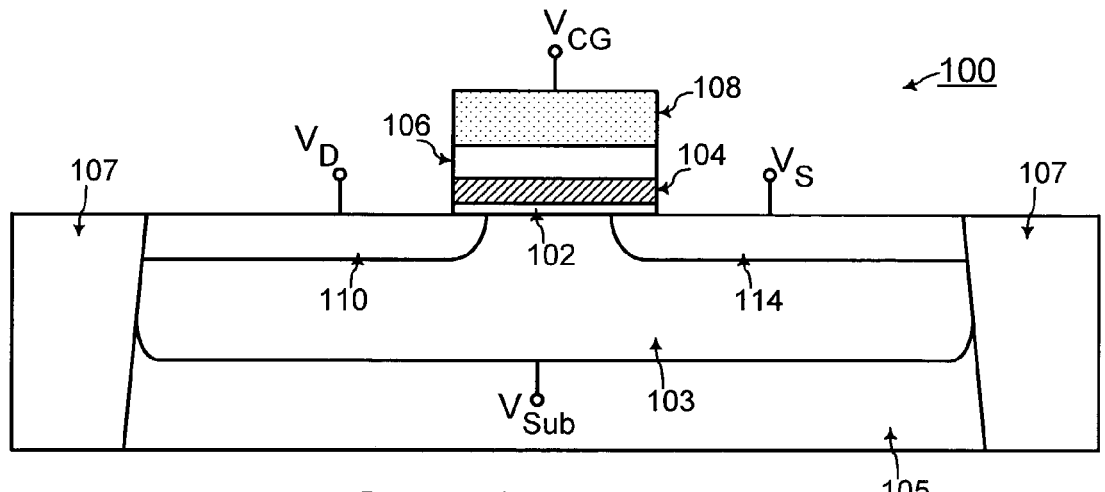
FIG. 1 shows a cross-sectional view of a flash memory cell, according to the prior art.
Figure 2:
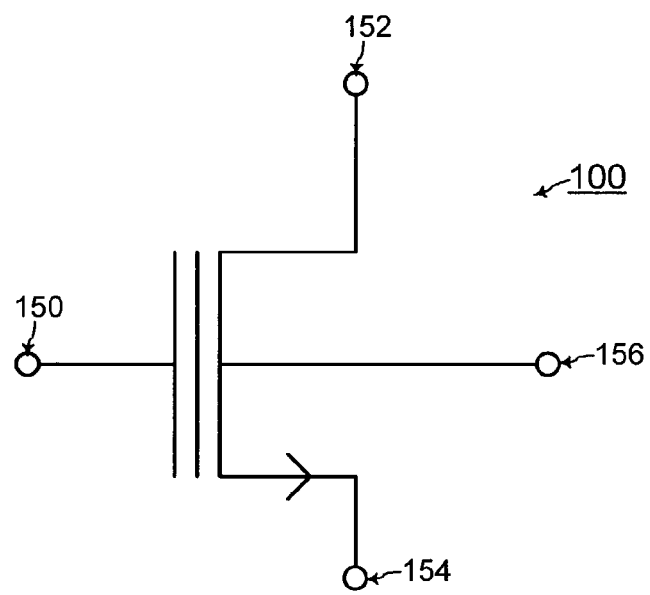
FIG. 2 shows a circuit diagram representation of the flash memory cell of FIG. 1, according to the prior art.
Figure 3:
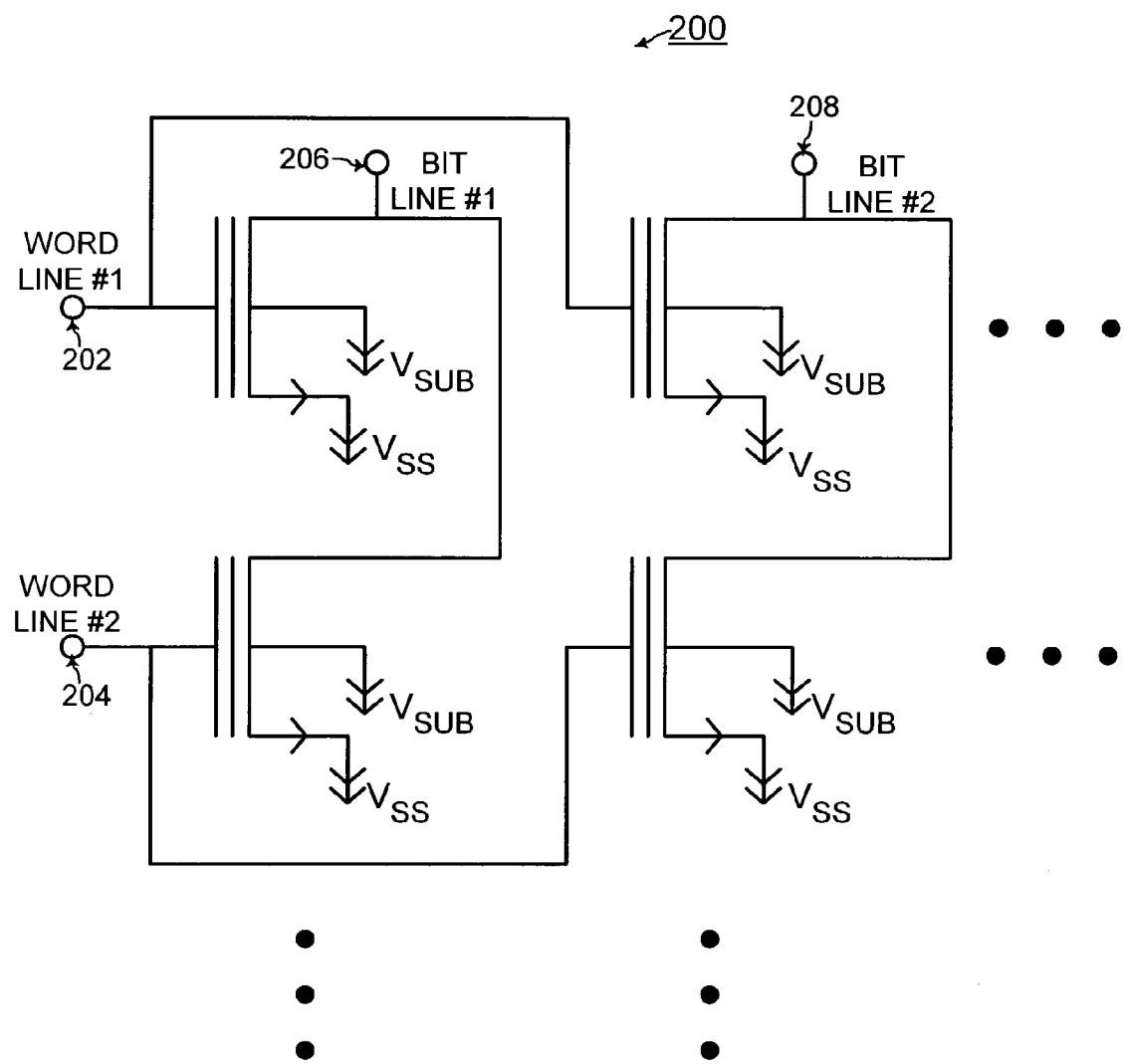
FIG. 3 shows an array of flash memory cells comprising a flash memory device, according to the prior art.
Figure 4:
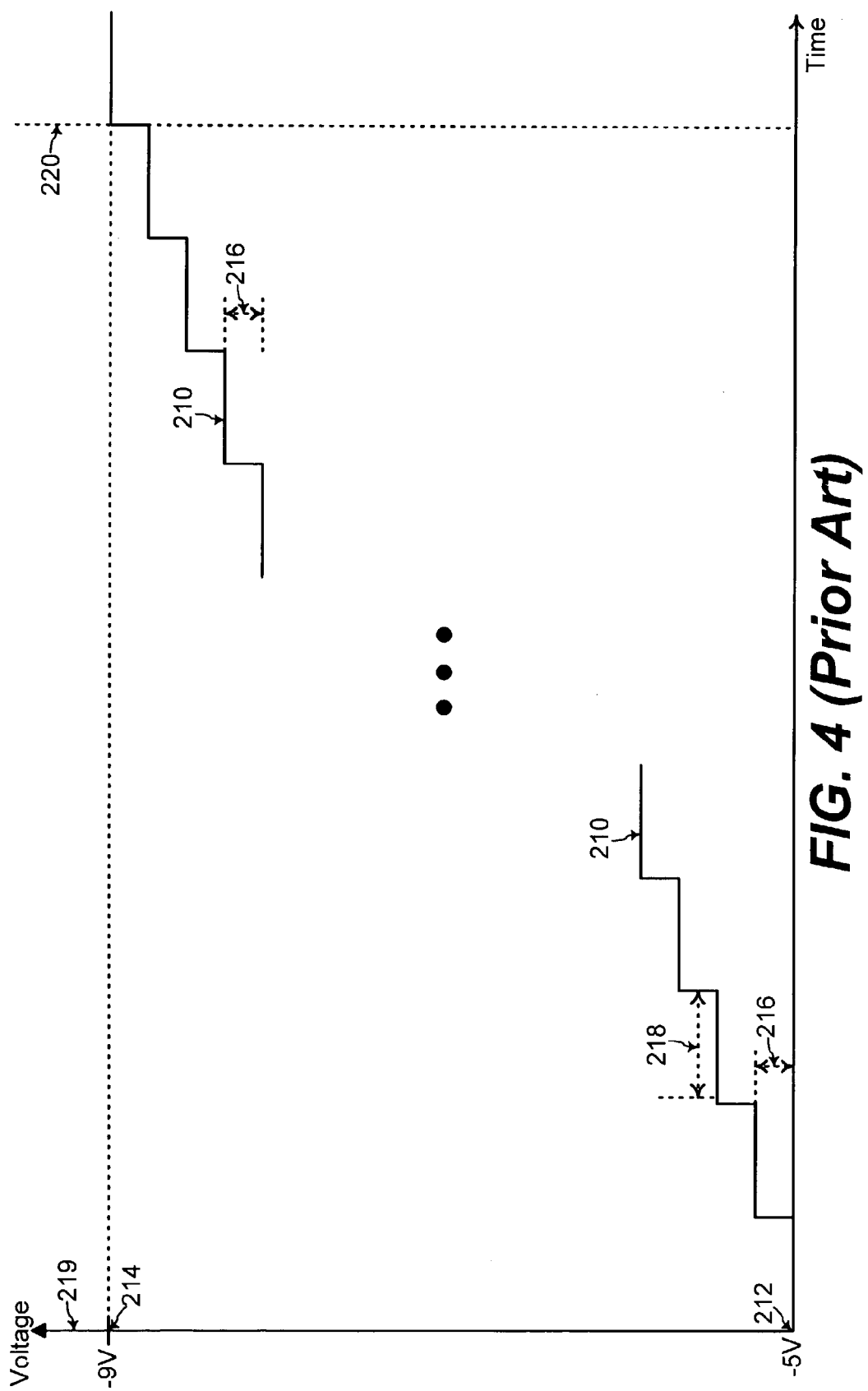
FIG. 4 shows a timing diagram of a testing voltage signal that ramps from an initial voltage to an end voltage in incremental voltage steps, according to the prior art.
Figure 5:
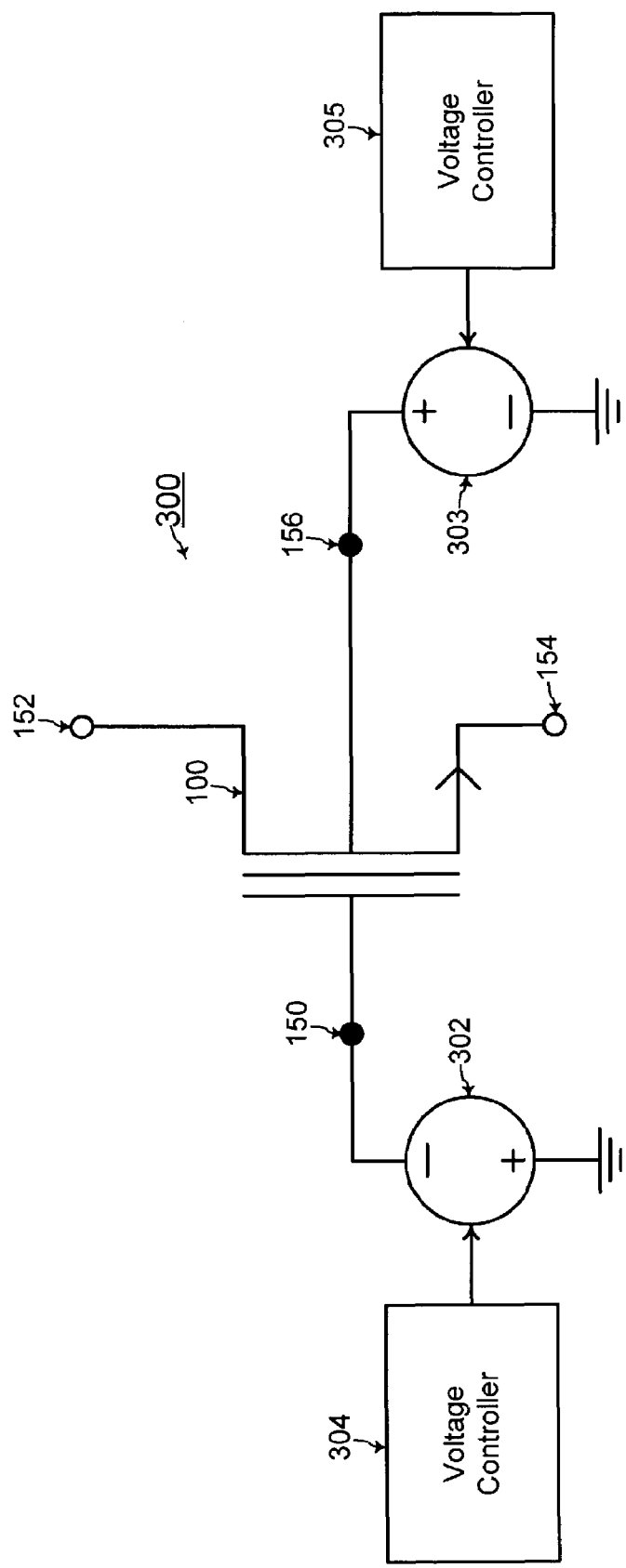
FIG. 5 shows a block diagram of components for applying a testing voltage signal with minimized time for ramping from an initial voltage to an end voltage, according to an embodiment of the present invention.
Figure 6:
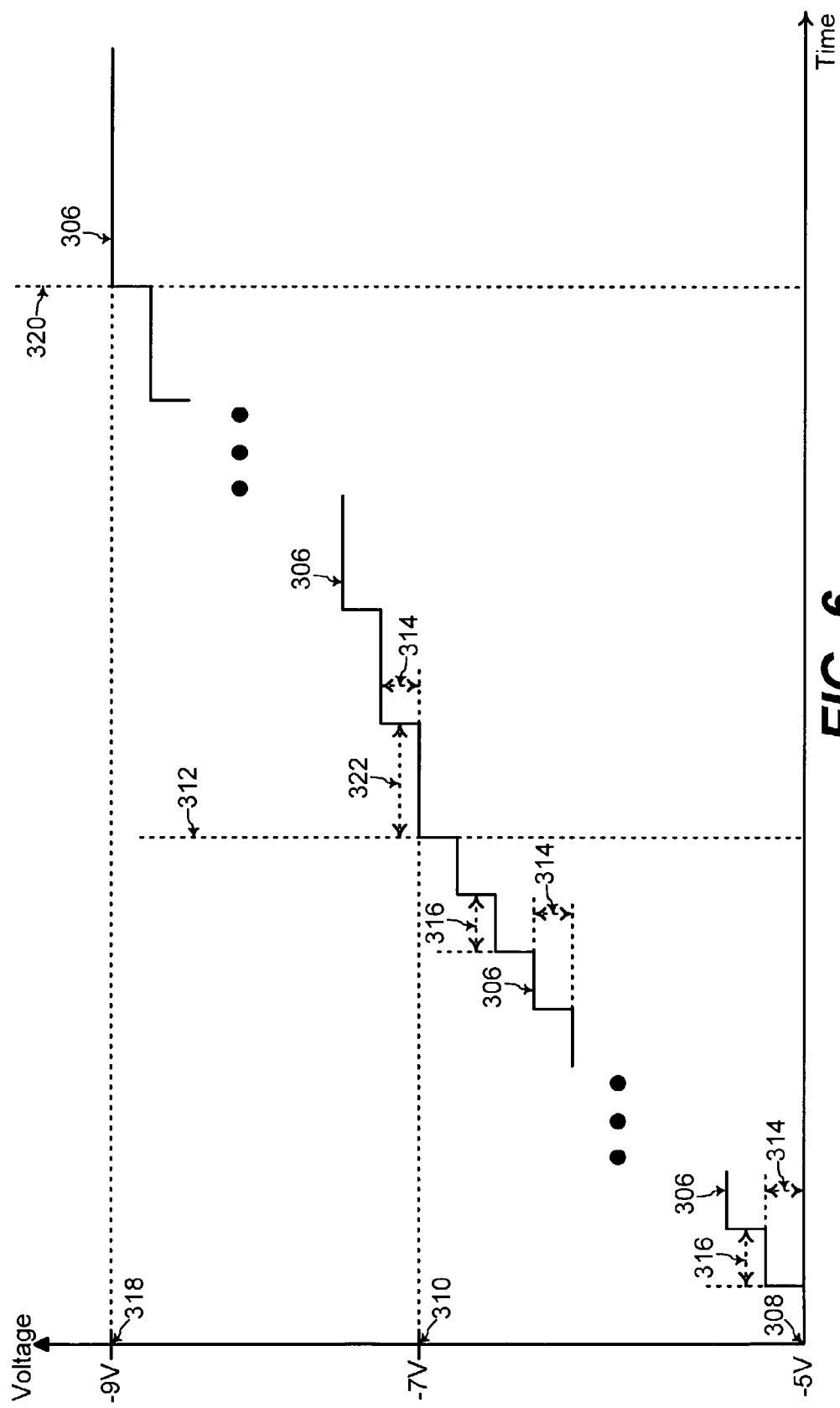
FIG. 6 shows a timing diagram of the testing voltage signal applied on the control gate of the flash memory cell in the system of FIG. 5 with minimized time for ramping from an initial voltage to an end voltage, according to an embodiment of the present invention.

Referring to FIG. 5, a system 300 for applying a testing voltage signal on the flash memory cell 100 includes a first voltage source 302 and a first voltage controller 304 coupled to the first voltage source 302. Referring to FIGS. 5 and 6, the first voltage controller 304 controls the first voltage source 302 to generate a testing voltage signal 306 to be applied on the control gate terminal 150 of the flash memory cell 100. Voltage sources for generating voltage signals and voltage controllers for controlling voltage sources are each individually known to one of ordinary skill in the art of electronics. For example, the voltage controller 304 may be a data processor that controls the voltage source 302 that is a variable voltage generator.

Referring to FIG. 6, the testing voltage signal starts at an initial voltage 308 such as −5 Volts for example. Then, the voltage controller 304 controls the voltage source 302 to ramp from the initial voltage 308 to an intermediate voltage 310 such as −7 Volts for example, by an intermediate time point 312. In one embodiment of the present invention, the voltage source 302 ramps from the initial voltage 308 to the intermediate voltage 310 by an incremental voltage step 314 every first time period 316.

For example, in one embodiment of the present invention, the testing voltage signal 306 ramps by the incremental voltage step 314 of −30.77 milli-Volts for every time period 316 of 1 micro-second. In that case, the intermediate voltage 310 is reached at the intermediate time point 312 after sixty-five incremental voltage steps from the initial voltage 308. Thus, the intermediate time point 312 is reached at sixty-five micro-seconds from the initial voltage 308.

Further referring to FIGS. 5 and 6, after the intermediate voltage 310 is reached at the intermediate time point 312, the voltage controller 304 controls the voltage source 302 to ramp from the intermediate voltage 310 to an end voltage 318 such as −9 Volts for example, by an end time point 320. In one embodiment of the present invention, the voltage source 302 ramps from the intermediate voltage 310 to the end voltage 318 by an incremental voltage step 314 every second time period 322.

For example, in one embodiment of the present invention, the testing voltage signal 306 ramps by the incremental voltage step 314 of −30.77 milli-Volts for every time period 322 of 1 milli-second. In that case, the end voltage 318 is reached at the end time point 320 after sixty-five incremental voltage steps from the intermediate voltage 310. Thus, the end time point 320 is reached at sixty-five milli-seconds from the intermediate voltage 310.

In such an example, the first ramp rate when the testing voltage signal 306 ramps from the initial voltage 308 (i.e., −5 Volts) to the intermediate voltage 310 (i.e., −7 Volts) is 1000 times faster than the second ramp rate when the testing voltage signal 306 ramps from the intermediate voltage 310 (i.e., −7 Volts) to the end voltage 318 (i.e., −9 Volts). In addition, in such an example, the intermediate voltage of −7 Volts is at least 70% of the end voltage of −9 Volts.

Such a testing voltage signal 306 is used to particular advantage when applied to the control gate terminal 150 of the flash memory cell 100 during testing of the flash memory cell 100. For example, for testing for channel erasure of the flash memory cell 100, the testing voltage signal 306 applied on the control gate terminal 150 ramps to the end voltage of −9 Volts. With such an embodiment of the present invention, the testing voltage signal 306 is ramped from the initial voltage 308 to the end voltage 318 with a minimized total time since the beginning portion of the testing voltage signal 306 (from the initial voltage 308 to the intermediate voltage 310) having lower magnitude is ramped at a faster rate. Yet, because the beginning portion of the testing voltage signal 306 having lower magnitude is ramped at the faster rate, degradation of the tunnel dielectric structure 102 of the flash memory cell 100 is limited.

Figure 7:
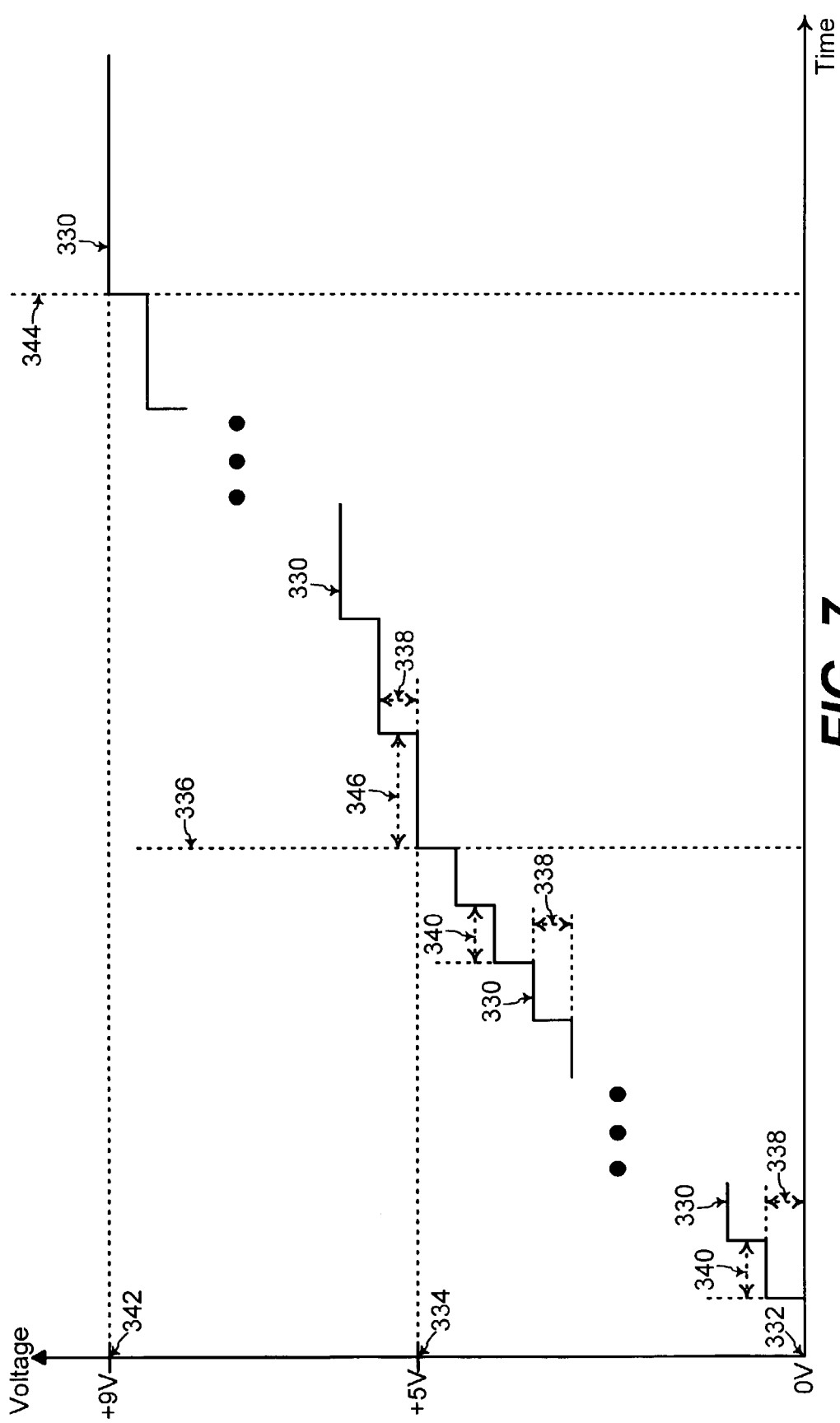
FIG. 7 shows a timing diagram of the testing voltage signal applied on the P-well of the flash memory cell in the system of FIG. 5 with minimized time for ramping from an initial voltage to an end voltage, according to an embodiment of the present invention.

In addition, referring to FIGS. 5 and 7, a second voltage controller 305 may also control a second voltage source 303 to generate another testing voltage signal 330 of positive voltage to be applied on the P-well terminal 156 of the flash memory cell 100. In that case, the testing voltage signal 330 of FIG. 7 ramps from an initial voltage 332 of +5 Volts to an intermediate voltage 334 of +7 Volts at intermediate time point 336 with an incremental voltage step 338 of +30.77 milli-Volts every first time period 340 such as every 1 micro-second. In addition, the testing voltage signal 330 ramps from the intermediate voltage 334 of +7 Volts to an end voltage 342 of +9 Volts at end time point 344 with the incremental voltage step 338 of +30.77 milli-Volts every second time period 346 such as every 1 milli-second.

For channel erasure of the flash memory cell 100, the end voltage of −9 Volts from the first voltage source 302 is applied on the control gate terminal 150, and the end voltage of +9 Volts from the second voltage source 303 is applied on the P-well terminal 156. In addition, the drain and source bit line junctions 110 and 114 of the flash memory cell 100 are left floating with such biases on the control gate 108 and the P-well 103.

The foregoing is by way of example only and is not intended to be limiting. For example, the testing voltage signal of the present invention may be applied for testing other integrated circuits aside from the example of flash memory cells. The present invention is limited only as defined in the following claims and equivalents thereof.

We claim:

1. A method for applying a testing voltage signal, including the steps of:
   A. ramping from an initial voltage to an intermediate voltage with a first ramping rate; and
   B. ramping from said intermediate voltage to an end voltage with a second ramping rate,
   wherein said first ramping rate is greater than said second ramping rate.

2. The method of claim 1, wherein a magnitude of said initial voltage is less than a magnitude of said intermediate voltage that is less than a magnitude of said end voltage, and wherein said magnitude of said intermediate voltage is at least 70% of said magnitude of said end voltage.

3. The method of claim 1, wherein said first ramping rate is at least 100 times greater than said second ramping rate.

4. The method of claim 3, wherein said first ramping rate is about 1000 times said second ramping rate.

5. The method of claim 1, wherein said step A includes ramping from said initial voltage to said intermediate voltage with an incremental voltage step every first time period.

6. The method of claim 5, wherein said step B includes ramping from said intermediate voltage to said end voltage with said incremental voltage step every second time period, and wherein said second time period is at least 100 times greater than said first time period.

7. The method of claim 6, wherein said second time period is about 1000 times said first time period.

8. The method of claim 1, wherein said step B includes ramping from said intermediate voltage to said end voltage with an incremental voltage step every time period.

9. The method of claim 1, wherein said testing voltage signal is applied on a control gate of a flash memory cell for channel erasure of said flash memory cell.

10. The method of claim 9, wherein said initial voltage is about −5 Volts, said intermediate voltage is about −7 Volts, and said end voltage is about −9 Volts, and wherein said step A includes ramping from said initial voltage to said intermediate voltage with an incremental voltage step every 1 micro-second, and wherein said step B includes ramping from said intermediate voltage to said end voltage with said incremental voltage step every 1 milli-second.

11. A system for applying a testing voltage signal, comprising:
   a voltage source for generating said testing voltage signal; and
   a voltage controller that controls said voltage source to ramp from an initial voltage to an intermediate voltage with a first ramping rate, and to ramp from said intermediate voltage to an end voltage with a second ramping rate,
   wherein said first ramping rate is greater than said second ramping rate.

12. The system of claim 11, wherein a magnitude of said initial voltage is less than a magnitude of said intermediate voltage that is less than a magnitude of said end voltage, and wherein said magnitude of said intermediate voltage is at least 70% of said magnitude of said end voltage.

13. The system of claim 11, wherein said first ramping rate is at least 100 times greater than said second ramping rate.

14. The system of claim 13, wherein said first ramping rate is about 1000 times said second ramping rate.

15. The system of claim 11, wherein said voltage controller controls said voltage source to ramp from said initial voltage to said intermediate voltage with an incremental voltage step every first time period.

16. The system of claim 15, wherein said voltage controller controls said voltage source to ramp from said intermediate voltage to said end voltage with said incremental voltage step every second time period, and wherein said second time period is at least 100 times greater than said first time period.

17. The system of claim 16, wherein said second time period is about 1000 times said first time period.

18. The system of claim 11, wherein said voltage controller controls said voltage source to ramp from said intermediate voltage to said end voltage with an incremental voltage step every time period.

19. The system of claim 11, wherein said testing voltage signal is applied on a control gate of a flash memory cell for channel erasure of said flash memory cell.

20. The system of claim 19, wherein said initial voltage is about −5 Volts, said intermediate voltage is about −7 Volts, and said end voltage is about −9 Volts, and wherein said voltage controller controls said voltage source to ramp from said initial voltage to said intermediate voltage with an incremental voltage step every 1 micro-second, and wherein said voltage controller controls said voltage source to ramp from said intermediate voltage to said end voltage with said incremental voltage step every 1 millisecond.

* * * * *